(12) United States Patent
Birner et al.

(10) Patent No.: US 10,665,531 B2
(45) Date of Patent: May 26, 2020

(54) LDMOS TRANSISTOR

(71) Applicant: Infineon Technologies AG, Neubiberg (DE)

(72) Inventors: Albert Birner, Regensburg (DE); Helmut Brech, Lappersdorf (DE); Matthias Zigldrum, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/272,545

(22) Filed: Feb. 11, 2019

(65) Prior Publication Data
US 2019/0172771 A1 Jun. 6, 2019

Related U.S. Application Data

(62) Division of application No. 15/191,989, filed on Jun. 24, 2016, now Pat. No. 10,242,932.

(51) Int. Cl.
| | |
|---|---|
| *H01L 23/48* | (2006.01) |
| *H01L 29/417* | (2006.01) |
| *H01L 29/66* | (2006.01) |
| *H01L 29/78* | (2006.01) |
| *H01L 23/532* | (2006.01) |
| *H01L 29/06* | (2006.01) |

(Continued)

(52) U.S. Cl.
CPC ...... *H01L 23/481* (2013.01); *H01L 21/76898* (2013.01); *H01L 23/53228* (2013.01); *H01L 29/063* (2013.01); *H01L 29/0696* (2013.01); *H01L 29/1095* (2013.01); *H01L 29/402* (2013.01); *H01L 29/4175* (2013.01); *H01L 29/66659* (2013.01); *H01L 29/7816* (2013.01); *H01L 29/7835* (2013.01); *H01L 23/53238* (2013.01); *H01L 29/0847* (2013.01); *H01L 29/1045* (2013.01); *H01L 29/404* (2013.01)

(58) Field of Classification Search
None
See application file for complete search history.

(56) References Cited

U.S. PATENT DOCUMENTS

| | | | |
|---|---|---|---|
| 5,252,848 A | 10/1993 | Adler et al. | |
| 6,048,772 A | 4/2000 | D'Anna | |

(Continued)

FOREIGN PATENT DOCUMENTS

| | | |
|---|---|---|
| CN | 101211799 A | 7/2008 |
| DE | 10348641 A1 | 5/2005 |
| DE | 102009012594 A1 | 12/2009 |

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Jay C Chang
(74) *Attorney, Agent, or Firm* — Murphy, Bilak & Homiller, PLLC (57) ABSTRACT

In an embodiment, a semiconductor device includes a semiconductor substrate having a front surface, a lateral transistor arranged in the front surface of the semiconductor substrate and having an intrinsic source, and a through substrate via. A first conductive layer lines side walls of the through substrate via and extends from the through substrate via onto the front surface of the semiconductor substrate and is electrically coupled with the intrinsic source of the lateral transistor.

16 Claims, 11 Drawing Sheets

(51) Int. Cl.
*H01L 29/10* (2006.01)
*H01L 29/40* (2006.01)
*H01L 29/08* (2006.01)
*H01L 21/768* (2006.01)

(56) References Cited

U.S. PATENT DOCUMENTS

| | | |
|---|---|---|
| 7,119,399 B2 | 10/2006 | Ma et al. |
| 7,221,034 B2 | 5/2007 | Ma et al. |
| 7,253,492 B2 | 8/2007 | Ma et al. |
| 7,456,094 B2 | 11/2008 | Ma et al. |
| 7,626,233 B2 | 12/2009 | Tornblad et al. |
| 7,772,123 B2 | 8/2010 | Birner et al. |
| 8,227,340 B2 | 7/2012 | Seidel et al. |
| 8,399,936 B2 | 3/2013 | Birner et al. |
| 8,518,764 B2 | 8/2013 | Dao et al. |
| 8,680,615 B2 | 3/2014 | Mitra et al. |
| 8,716,791 B1 | 5/2014 | Iravani et al. |
| 8,890,324 B2 | 11/2014 | Dao |
| 9,064,712 B2 | 6/2015 | Sanders et al. |
| 9,165,918 B1 | 10/2015 | Yang et al. |
| 9,245,952 B2 | 1/2016 | Yao et al. |
| 2002/0038891 A1 | 4/2002 | Ryu et al. |
| 2004/0067632 A1 | 4/2004 | Andoh et al. |
| 2004/0229456 A1 | 11/2004 | Andricacos et al. |
| 2006/0046350 A1 | 3/2006 | Jiang et al. |
| 2006/0183317 A1 | 8/2006 | Noguchi et al. |
| 2006/0289924 A1* | 12/2006 | Wang ............... H01L 29/40114 257/315 |
| 2008/0093641 A1 | 4/2008 | Ludikhuize et al. |
| 2008/0119007 A1 | 5/2008 | Raghuram et al. |
| 2008/0166849 A1 | 7/2008 | Yang et al. |
| 2009/0026539 A1 | 1/2009 | Birner et al. |
| 2009/0294849 A1 | 12/2009 | Min et al. |
| 2009/0302480 A1 | 12/2009 | Birner et al. |
| 2010/0022084 A1 | 1/2010 | Chen et al. |
| 2010/0032756 A1 | 2/2010 | Pendharkar et al. |
| 2010/0230818 A1* | 9/2010 | Birner ............... H01L 21/76898 257/751 |
| 2010/0295154 A1 | 11/2010 | Riess |
| 2011/0024839 A1 | 2/2011 | Zinn et al. |
| 2011/0074040 A1 | 3/2011 | Frank et al. |
| 2011/0095365 A1 | 4/2011 | French et al. |
| 2011/0101425 A1 | 5/2011 | Grote et al. |
| 2011/0309442 A1 | 12/2011 | Grote et al. |
| 2012/0037969 A1* | 2/2012 | Sanders ............... H01L 23/481 257/296 |
| 2012/0061758 A1 | 3/2012 | Khan et al. |
| 2012/0061798 A1 | 3/2012 | Wong et al. |
| 2012/0228778 A1 | 9/2012 | Kosenko et al. |
| 2012/0273840 A1 | 11/2012 | Luo et al. |
| 2013/0119547 A1 | 5/2013 | Kim et al. |
| 2013/0207183 A1 | 8/2013 | Kao |
| 2014/0084473 A1 | 3/2014 | Moon et al. |
| 2014/0225186 A1 | 8/2014 | Abou-Khalil et al. |
| 2014/0264896 A1 | 9/2014 | Lu et al. |
| 2015/0001720 A1 | 1/2015 | Lin et al. |
| 2015/0097238 A1 | 4/2015 | Zhang et al. |
| 2015/0243583 A1 | 8/2015 | Li et al. |
| 2015/0251382 A1 | 9/2015 | Terasaki et al. |
| 2015/0294898 A1 | 10/2015 | Yamaguchi |
| 2016/0141362 A1 | 5/2016 | Gogoi |
| 2016/0141369 A1 | 5/2016 | Kim et al. |
| 2016/0307823 A1 | 10/2016 | Fang et al. |
| 2017/0330790 A1 | 11/2017 | He et al. |

* cited by examiner

LDMOS TRANSISTOR

BACKGROUND

There is an ongoing need for solid state circuits adapted to operate at higher and higher frequencies, including microwave frequencies. As used herein, the term "microwave" is intended to refer to frequencies at or above about 300 MHz, for example between 300 Mz and 3 GHz. Various transistor structures have been created that are capable of providing gain in such frequency ranges. A LDMOS (Lateral Diffused Metal Oxide Semiconductor) transistor is an example of such a transistor structure.

In some lateral transistor devices, such as a LDMOS transistor device, the source is typically coupled to the rear side of the substrate in which the transistor structure is formed. The source may be coupled by a highly doped region of the substrate, commonly known as a sinker structure, or a conductive through substrate via (TSV) to the rear side of the substrate.

Further improvements to the connection between the source and the rear surface of the substrate are desirable.

SUMMARY

In an embodiment, a semiconductor device includes a semiconductor substrate including a front surface, a LDMOS transistor arranged in the front surface of the semiconductor substrate and having an intrinsic source, and a through substrate via. A first conductive layer lines sidewalls of the through substrate via and extends from the through substrate via onto the front surface of the semiconductor substrate. The first conductive layer is electrically coupled with the intrinsic source.

In an embodiment, a method for electrically coupling an electrode of a transistor structure arranged at a first surface of a substrate to a conductive layer arranged at a second surface of the substrate opposing the first surface is provided. The method includes forming a blind via in the substrate adjacent the transistor structure, depositing a first conductive layer onto side walls of the blind via and a region of a second conductive layer arranged on the first surface of the substrate adjacent the blind via and coupled to the electrode of the transistor structure, working the second surface of the substrate to expose a portion of the first conductive layer, and depositing a third conductive layer onto the second surface of the substrate and the portion of the first conductive layer to electrically couple the third conductive layer with the electrode of the transistor structure.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 3 illustrates a plan view of the transistor device of FIG. 2a.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

It will be understood by those of skill in the art that the active device(s), such as a LDMOS transistor, may be formed on or over the substrate or entirely within the substrate or partly within and partly on or over the substrate, depending upon the nature of the device(s). Accordingly, as used herein with respect to the active device(s), the terms "in the substrate", "in the semiconductor substrate" and equivalents are intended to include all such variations.

Figure 1:
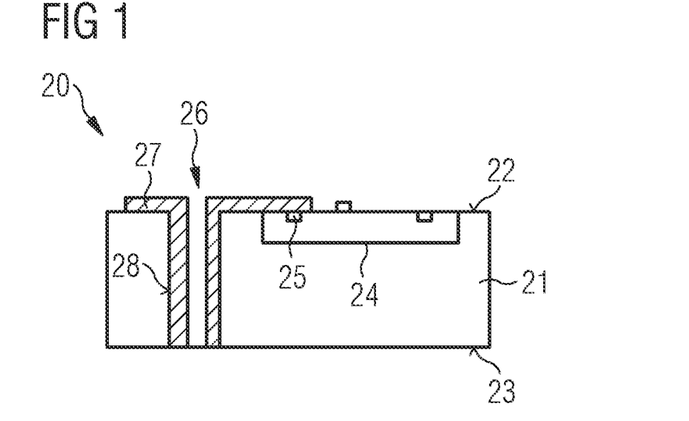
FIG. 1 illustrates a semiconductor device including a transistor structure and a through substrate via.

FIG. 1 illustrates a semiconductor device 20 including a semiconductor substrate 21 including a front surface 22 and a rear surface 23. The semiconductor device 20 further includes a transistor structure 24 arranged in the front surface 22 of the substrate 21 which has an intrinsic source 25. The semiconductor device 20 also includes a through substrate via (TSV) 26 which extends from the front surface 22 to the rear surface 23. A first conductive layer 27 lines sidewalls 28 of the through substrate via 26 and extends from the through substrate via 26 laterally onto the front surface 22 of the substrate 20. The first conductive layer 27 is electrically coupled to the intrinsic source 25.

The first conductive layer 27 extends from the rear surface 23 vertically through the semiconductor substrate 21 to the first surface 22 and laterally from the through substrate via 26 on the front surface 22 of the substrate 21 in the direction of the intrinsic source 25 of the transistor structure 24. The first conductive layer 27 electrically couples the intrinsic source 25 to the rear surface 23 of semiconductor substrate 21. The first conductive layer 27 may include high purity copper and may be fabricated using dual Damascene techniques.

The first conductive layer 27 provides a redistribution path that has a vertical portion within the through substrate via 26 and a lateral portion on the front surface 21 of the semiconductor substrate 21. The vertical portion and the lateral portion are integral and may be formed using a single deposition process. The deposition process may be electroplating.

The transistor structure 24 may be a lateral transistor structure having a lateral drift path. The transistor structure may be a LDMOS (Laterally Diffused Metal Oxide Semiconductor) transistor.

The semiconductor device 20 may further include a second conductive layer arranged on the front surface 22 of the substrate 21 which is coupled to the intrinsic source 25. The second conductive layer may be part of the first layer of metallization, for example the first layer of the Front-End Of Line (FEOL) metallization of the transistor structure 24. The first conductive layer 27 is arranged on a portion of second conductive layer. In particular, the first conductive layer 27 may be in direct contact with the second conductive layer and provide a large area surface-to-surface contact between the first conductive layer 27 and the second conductive layer.

The first conductive layer 27 may have a lateral extent such that it is positioned laterally adjacent and spaced apart from the intrinsic source 25. The second conductive layer has a lateral extent such that it extends from the intrinsic source 25 underneath a portion of the first conductive layer 27 arranged on the front surface 22. The second conductive layer may be spaced apart from the through substrate via 26. A portion of the second conductive layer is uncovered by first conductive layer 27. The combination of the second conductive layer and the portion of the first conductive layer 27 arranged on the front surface 22 of the substrate 21 provides a lateral redistribution of the source connection between the intrinsic source 25 and the through substrate via 26.

The first conductive layer 27 may be thicker than the second conductive layer. In some embodiments, the first conductive layer has a thickness $t_1$ and the second conductive layer has a thickness $t_2$, wherein $t_1 \geq 5t_2$. The first conductive layer may include high purity copper and the second conductive layer may include Ti or TiN. The high purity copper layer may be deposited using electroplating techniques and the titanium layer may be deposited using vacuum deposition techniques such as Physical Vapour Deposition or Chemical Vapour Deposition.

The through substrate via 26 may have different lateral shapes. For example, the through substrate via 26 may have an elongate lateral area, for example rectangular, or may have a square, circular or hexagonal lateral shape.

A plurality of through substrate vias may be provided for a single conductive connection between the intrinsic source and the rear surface of the substrate. The through substrate vias may be arranged in a row which extend substantially parallel to the intrinsic source 25.

The semiconductor substrate 21 may have a bulk resistivity of greater or equal to 100 Ohm·cm and may be described as highly resistive. In some embodiments, the highly resistive semiconductor substrate 21 includes silicon and may include a silicon single crystal.

When the bulk resistivity of the semiconductor substrate is equal or greater than a predetermined level, the substrate related inductive and capacitive parasitics can be reduced. The desirable predetermined level is usefully equal or greater than 100 Ohm·cm resistivity, conveniently equal or greater than about 500 Ohm·cm resistivity, more conveniently equal or greater than about 1000 Ohm·cm resistivity. As used herein, the term "bulk resistivity" refers to those portions of substrate 21 that lie outside the device regions, e.g., outside of the doped regions of the LDMOS transistor and any associated RESURF structure.

In some embodiments, the semiconductor substrate 21 includes a highly doped silicon substrate, such as a silicon wafer, and an epitaxial silicon layer based on the highly doped silicon substrate. The LDMOS transistor is arranged in the front surface of the epitaxial silicon layer.

The semiconductor device 20 may further include a third conductive layer on the rear surface 23 of the substrate 31 which is electrically coupled to the intrinsic source by way of the first conductive layer 27 and the second conductive layer.

A multilayer liner structure may be provided between the first conductive layer and the side walls of the through substrate via 26 and between the first conductive layer 27 and the front surface 22 of the substrate 21. A portion of the multilayer liner structure on the side walls of the through substrate via 26 may have a different number of layers from a portion of the multilayer liner deposited on the front surface 22 of the substrate 21. The multilayer liner may be in direct contact with the semiconductor substrate 21.

The conductive path provided in the through substrate via 26 may have different forms. In some embodiments, a conductive plug is arranged at a base of the through substrate via and a first conductive layer is arranged on the conductive plug. The conductive plug fills the via, whereas the first conductive connection layer arranged on the conductive plug surrounds a gap. In some embodiments, the first conductive layer 26 lines the walls and surrounds a gap which extends through the entire thickness of the substrate 21 from the rear surface 23 to the front surface 22.

In some embodiments, the through substrate via 26 further includes one or more dielectric layers on the first conductive layer which encloses a cavity within the through substrate via.

Figure 2A:
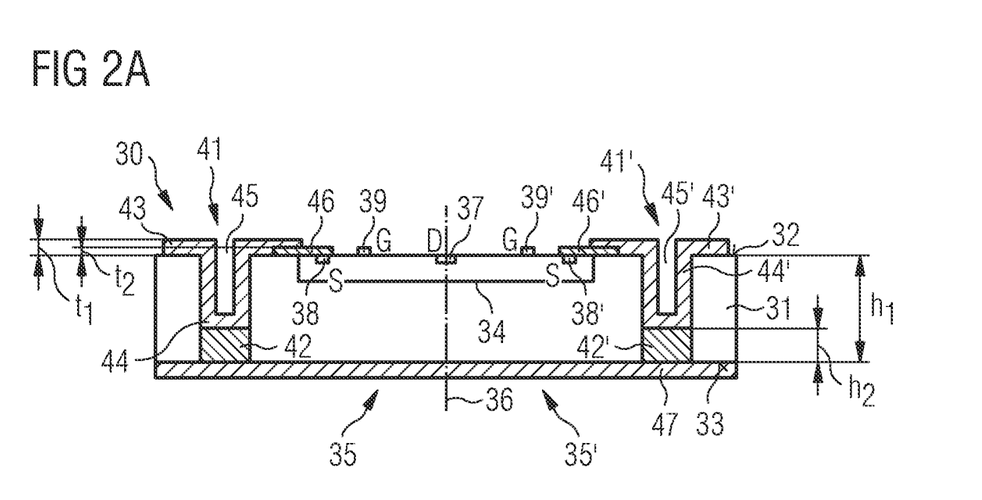
FIG. 2a illustrates a semiconductor device including a transistor structure and a through substrate via.
Figure 3:
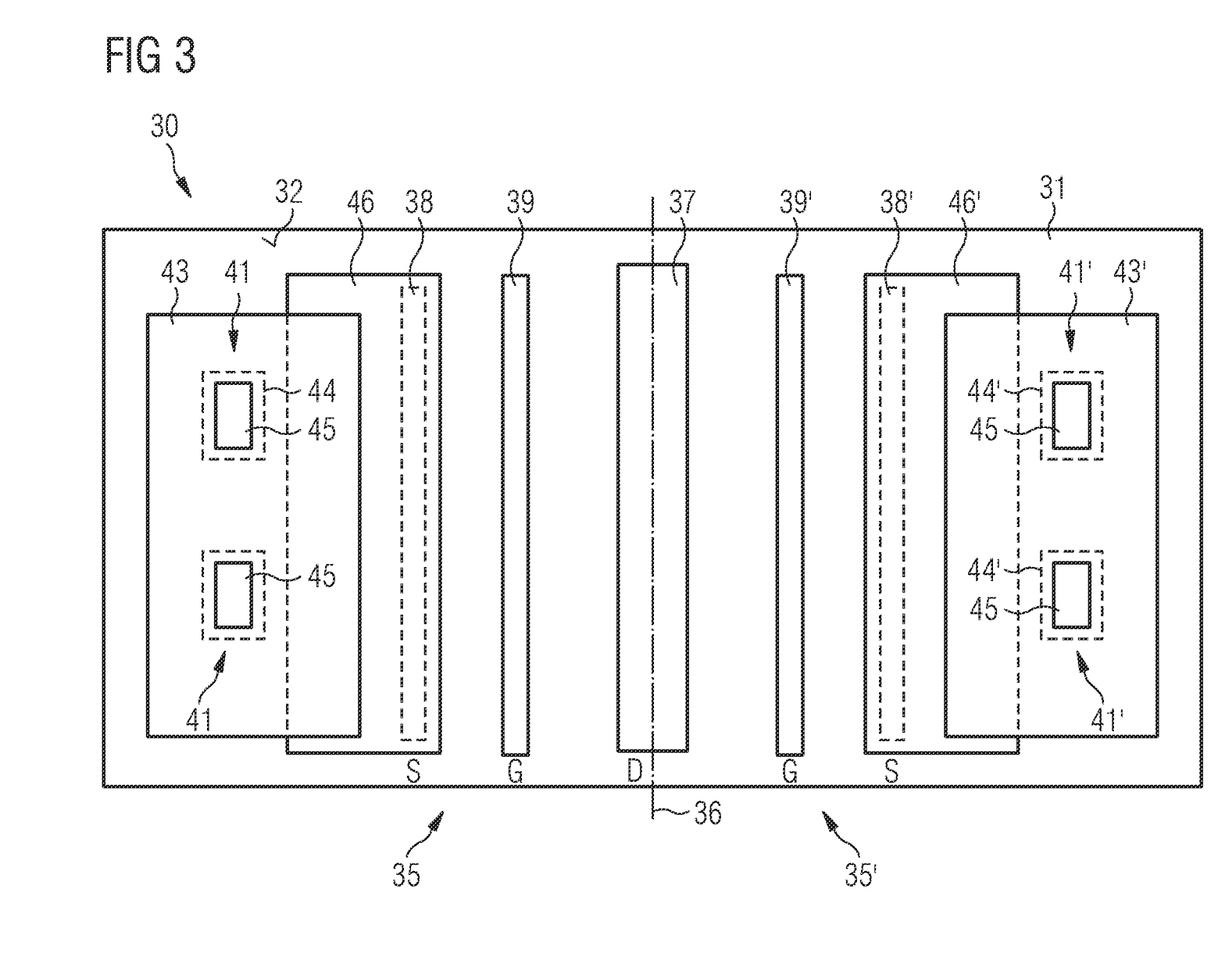

FIG. 2a illustrates a cross-sectional view and FIG. 3 a plan view of a portion of a semiconductor device 30 including a semiconductor substrate 31 having a front surface 32 and a rear surface 33. A LDMOS transistor 34 is arranged in the front surface 32 of the substrate 31. In the embodiment of FIG. 2a, the semiconductor substrate 31 is a highly resistive substrate with a bulk resistivity of greater or equal to 100 ohm·cm.

The LDMOS transistor 34 includes a plurality of transistor cells or segments which are coupled in parallel with one another. FIG. 2 illustrates two transistor cells 35, 35' which have a symmetric arrangement about a centreline 36, whereby a drain region 37, which is common to both transistor cells 35, 35', is arranged symmetrically at the centreline 36. Each transistor cell 35, 35' includes a source region 38 or intrinsic source and a gate 39 arranged laterally between the source region 38 and the drain region 37.

The semiconductor device 30 includes a through substrate via 41 which extends from the front surface 32 to the surface 33 of the substrate 31. At least one through substrate via 41 is arranged laterally adjacent and spaced apart from the source region 38 of each transistor cell 35, 35'. A conductive path is provided from the front surface 32 to the rear surface 33 by conductive material which is inserted in the through substrate via 41.

One or more liner layers providing adhesion promotion, a diffusion barrier and/or a seed layer arranged between the material of the semiconductor substrate 11 defining the side walls of the TSV 40 and the conductive lining 41.

In the embodiment illustrated in FIG. 2a, the conductive path within the through substrate via 41 is provided by two conductive portions. A first conductive portion 42 is arranged at the base of the through substrate via 41 adjacent the rear surface 33. The first conductive portion 42 fills the base of the through substrate via 41 and has a lower surface which is substantially co-planar with the rear surface 33 of the substrate 31. A second conductive portion has the form of a first conductive layer 43 which lines sidewalls 44 of the upper portion of the through substrate via 41 and surrounds a gap 45 in the upper portion of the through substrate via 41. The first conductive layer 43 may be conformally deposited such that it covers the upper surface of the first conductive portion 42 and the sidewalls 44 and extends laterally onto the front surface 32 of the substrate 31 in regions adjacent the through substrate via 41. The first conductive portion 42 and the first conductive layer 43 include high purity copper. The first conductive portion 42 and the first conductive layer 43 may have different microstructures, for example different average grain sizes. An interface between the first conductive portion 42 and the first conductive layer 43 may be discernible in some embodiments.

The conductive through substrate via 41 and the substrate 31 may have a height $h_1$ and the first conductive portion 42 may have a height $h_2$, wherein $h_2 \leq 2h_1/3$. As an example, 20 µm $\leq h_1 \leq$ 100 µm and 5 µm $\leq h_2 \leq$ 70 µm.

The second conductive portion 43 may have a thickness t, for example 0.5 µm $\leq t \leq$ 3 µm, and the first conductive portion 42 may have a height $h_2$, for example 5 µm $\leq h_2 \leq$ 70 µm.

The semiconductor device 30 includes a metallisation structure 40 arranged on the front surface of the LDMOS transistor 34. The metallisation structure 40 may include a second conductive layer 46 in the form of a source metal contact which is coupled to the source region 38 and which extends laterally outwardly from the centreline 36 in the direction of the through substrate via 41. The second conductive layer 46 may include Ti.

The distal portion of the first conductive layer 43, which extends inwardly with respect to the centreline 36, is arranged on the distal portion of the second conductive layer 46 to provide a large area surface-to-surface contact between the first conductive layer 43 and the second conductive layer 46 to electrically couple the source region 38 to the rear surface 33 of the substrate 31.

The first conductive layer 43 may have a thickness $t_1$ and the second conductive layer may have a thickness $t_2$, wherein $t_1 \geq 5t_2$.

A third conductive layer 47 may be arranged on the rear surface 33 of the semiconductor substrate 31 that is in direct contact with the first conductive portion 42 within the through substrate via 41. The third conductive layer 47 may have a solderable surface or include solder to enable the semiconductor substrate 31 to be mounted on, and electrically coupled to, a die pad or ground plane of a package. The third conductive layer 47 may include two or more sublayers, for example a metallic layer and a solderable layer.

FIG. 3 illustrates a plan view of the front surface 22 of the semiconductor device 30. The source region 38, gate 39 and drain region 37 of each of the transistor cells 35, 35' have a strip-like elongate form and extend substantially parallel to one another. The through substrate via 41 may be one of a plurality of through substrate vias arranged in a row laterally outward of the source region 38 with respect to the centreline 36. The first conductive layer 43 is arranged on the side walls 44 of the through substrate vias 41 and extends onto the front surface 22 in regions adjacent the through substrate vias 41. The first conductive layer 43 overlaps with a distal portion of the second conductive layer 46 which is arranged on and electrically coupled with the source region 38. A portion of the second conductive layer 46 is uncovered by the first conductive layer 43 and positioned laterally inwardly of the second conductive layer 46. The first conductive layer 43 is arranged laterally adjacent and spaced apart from the source region 38. If a plurality of through substrate vias are provided, they may be arranged in a row which extends substantially parallel to the source region 38.

Figure 2B:
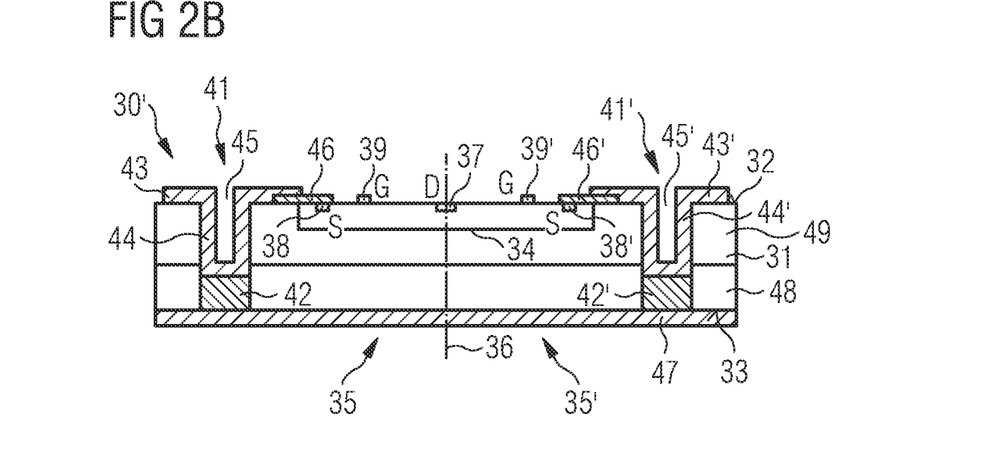
FIG. 2b illustrates a semiconductor device including a transistor structure and a through substrate via.

FIG. 2b illustrates a cross-sectional view of a semiconductor device 30' which differs from the semiconductor device 30 solely in the semiconductor substrate 31. The semiconductor device 30 includes a highly doped semiconductor substrate 48 and an epitaxial layer 49 on the highly doped semiconductor substrate 48. The highly doped semiconductor substrate 48 may include a p+ doped silicon wafer and the epitaxial layer 49 p-doped silicon.

Figure 4:
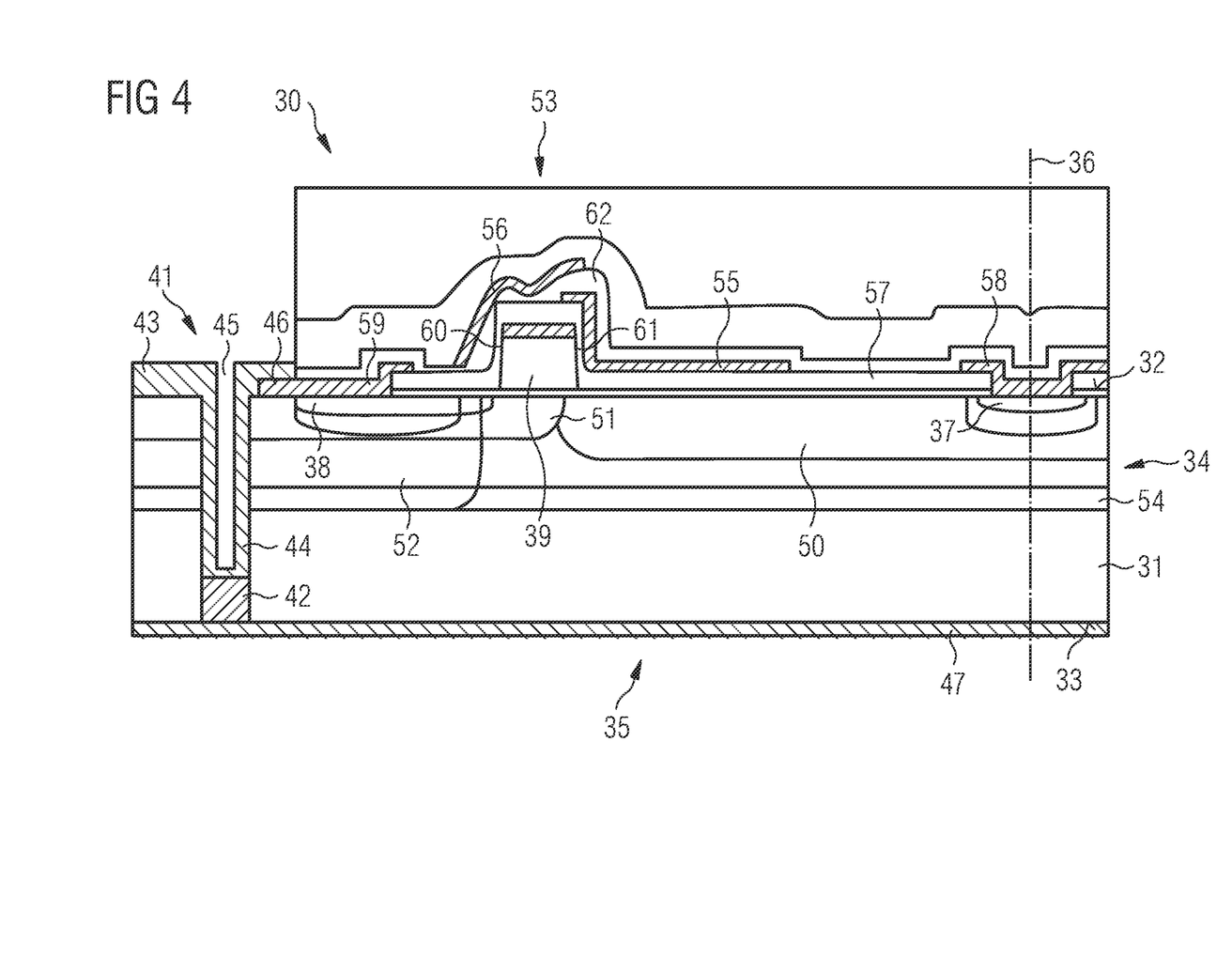
FIG. 4 illustrates a semiconductor device including a LDMOS transistor and a through substrate via.

FIG. 4 illustrates a more detailed view of a LDMOS transistor structure 34 which may be used in the semiconductor device 30. The relationship between the illustrated dimensions of the LDMOS transistor structure 34 and through substrate via 41 is not to scale. In particular, for illustration purposes, the dimensions of the LDMOS transistor structure 34 are enlarged. The LDMOS transistor 34 includes a plurality of transistor cells 35, 35' each including a doped source region 38, a doped drain region 37 and a gate 39 arranged in the front surface 32 of the semiconductor substrate 21. The gate 39 is laterally arranged between the source region 38 and drain region 37. The gate 39 may be asymmetrically arranged between source region 38 and drain region 37 such that the distance between the source region 38 and the gate 39 is less than the distance between the gate 39 and the drain region 37.

In some embodiments, the semiconductor substrate 31 may include silicon which is lightly doped with a first conductivity type, for example p--, and highly resistive. In embodiments in which the semiconductor substrate 31 includes a highly doped substrate and an epitaxial layer, the highly doped substrate may be p+ and the epitaxial layer p-doped.

The source region 38 is highly doped with a second conductivity type, for example n+, and the drain region 37 which is highly doped with the second conductivity type, for example n+.

A drift region 50 extends into the front surface 32 under the gate 39 in the direction of the drain region 37 and may be doped with the second conductivity type, for example n. The drift region 50 extends further into the semiconductor substrate 31 than the drain region 37. The drift region 50 is doped with the second conductivity type, for example n, and has a dopant concentration which is less than the dopant concentration of the drain region 37 and of the source region 38.

The LDMOS transistor 24 further includes a channel region 51 doped with the first conductivity type, for example p, which extends from the drift region 50 under the source region 38 and a body contact region 52 which is doped with the first conductivity type and extends from the front surface 32 into the semiconductor substrate 31 deeper than the channel region 51. The drift region 50 extends into the semiconductor substrate 31 by a greater distance than a channel region 51. The body contact region 52 is provided by a highly doped well of the first conductivity type, for example p+.

The drain region 37 has doping concentration usefully at least $5.10^{19}$ cm$^{-3}$, conveniently at least $1.10^{20}$ cm$^{-3}$ and more conveniently at least $3.10^{20}$ cm$^{-3}$, but higher or lower doping concentrations may also be used. The drift region 50 laterally abut the drain region 37 in a symmetric structure and have a doping concentration which is usefully in the range of $1.10^{16}$ cm$^{-3}$ to $1.10^{18}$ cm$^{-3}$, conveniently in the range of $7.10^{16}$ cm$^{-3}$ to $3.10^{17}$ cm$^{-3}$, and more conveniently in the range of $1.10^{17}$ cm$^{-3}$ to $2.10^{17}$ cm$^{-3}$, but higher or lower doping concentrations may also be used. Laterally outboard of drift regions 50 with respect to the centre line 36 are channel regions 51 underlying at least a portion of gate 39. The channel regions 51 have a doping concentration usefully in the range of $1.10^{17}$ cm$^{-3}$ to $2.10^{18}$ cm$^{-3}$, conveniently in the range of $3.10^{17}$ cm$^{-3}$ to $1.10^{18}$ cm$^{-3}$, and more conveniently in the range of $5.10^{17}$ cm$^{-3}$ to $9.10^{17}$ cm$^{-3}$, but higher or lower doping concentrations may also be used. Laterally outboard of channel regions 51 are source regions 38. Source regions 38 have doping concentration usefully of at least $5.10^{19}$ cm$^{-3}$, conveniently of at least $1.10^{20}$ cm$^{-3}$, and more conveniently of at least $3.10^{20}$ cm$^{-3}$, but higher or lower doping concentrations may also be used. Laterally outboard of source regions 38 are the body contact regions 52. The body contact regions 52 have doping concentration usefully in the range of $1.10^{18}$ cm$^{-3}$ to $1.10^{20}$ cm$^{-3}$, conveniently in the range of $2.10^{18}$ cm$^{-3}$ to $7.10^{19}$ cm$^{-3}$, and more conveniently in the range of $5.10^{18}$ cm$^{-3}$ to $5.10^{19}$ cm$^{-3}$, but higher or lower doping concentrations may also be used. The substrate 31 may have a doping concentration in the range of $1.10^{17}$ cm$^{-3}$ to $2.10^{18}$ cm$^{-3}$.

When the gate 39 is appropriately biased, a conductive channel forms between the source region 38 and the drain region 37. The exemplary conductivity types presented above are suitable for forming an N-channel structure, but a P-channel structure can also be formed by appropriate interchange of conductivity type of the various doped regions and appropriate modification of the bias on gate 39.

In embodiments in which the LDMOS transistor 34 includes a substrate with a bulk resistivity of greater or equal to 100 Ohm·cm, it may further include a RESURF structure 53. The RESURF structure 53 may include a doped buried layer 54 in addition to a field plate 55 and the drift region 50. The RESURF structure 53 is provided to reduce the electric field at the front surface 32 of the semiconductor substrate 31 and, in particular, the electric field at the front surface 32 of the semiconductor substrate 31 at the drain-side edge of the gate 39 and in the direction of the drain 37. The RESURF structure 53 may be used to increase the breakdown voltage of the transistor whilst maintaining a low on-resistance.

The doped buried layer 54 of the RESURF structure 53 extends continuously through out the lateral area of the semiconductor substrate 31 and continuously under the source region 38, gate 39 and drain region 37 of the LDMOS transistor 34. The doped buried layer 54 is spaced apart from the drift region 51 and the channel region 52 by a portion of the semiconductor substrate 31. The doped buried layer 54 has a dopant concentration of the first conductivity type which is greater than the dopant concentration of the semiconductor substrate 31 and less than the dopant concentration of the channel region 52. The doped buried layer 54 may have a doping concentration in the range of $1.10^{13}$ cm$^{-3}$ to $2.10^{15}$ cm$^{-3}$.

The semiconductor device 30 includes a first dielectric layer 57, for example an oxide layer, on the front surface 32 of the semiconductor substrate 31 which is structured and has an opening above the drain region 37 in which a drain metal contact 58 is formed and an opening over the source region 38 in which a source metal contact 59 is formed. The source metal contact 59 extends into the conductive layer 46. The first dielectric layer 57 covers the gate 39 and extends between the source-gate edge 60 and the source metal contact 59 and between the drain-sided gate edge 61 and the drain metal contact 58.

The field plate 55 is positioned on the first dielectric layer 57 above the gate 39 and extends on the first dielectric layer 57 in the direction of the drain metal contact 58.

A dielectric layer 62 is arranged on the field plate 55 and extends over the gate 39, the source metal contact 59 and the drain metal contact 58. The gate shield 56 is positioned on the dielectric layer 62 on the gate 39 and partially overlaps with the field plate 55. The gate shield 56 extends from the gate 21 in the direction of the source region 19.

The source region 38 of the LDMOS transistor 34 is coupled to the rear surface 33 of the semiconductor substrate 31 by the conductive layer 46 and through substrate via 41, which in the embodiment illustrated in FIG. 4, includes a first portion 42, which fills the base of the through substrate via 41 adjacent the rear surface 33, and a conductive layer 42 which surrounds the gap 43 in the upper portion of the through substrate via 41 and extends onto the front surface 32 and onto the conductive layer 46. The through substrate via 41 may be positioned such that the body contact 52 surrounds the upper portion of the conductive via.

Figure 5:
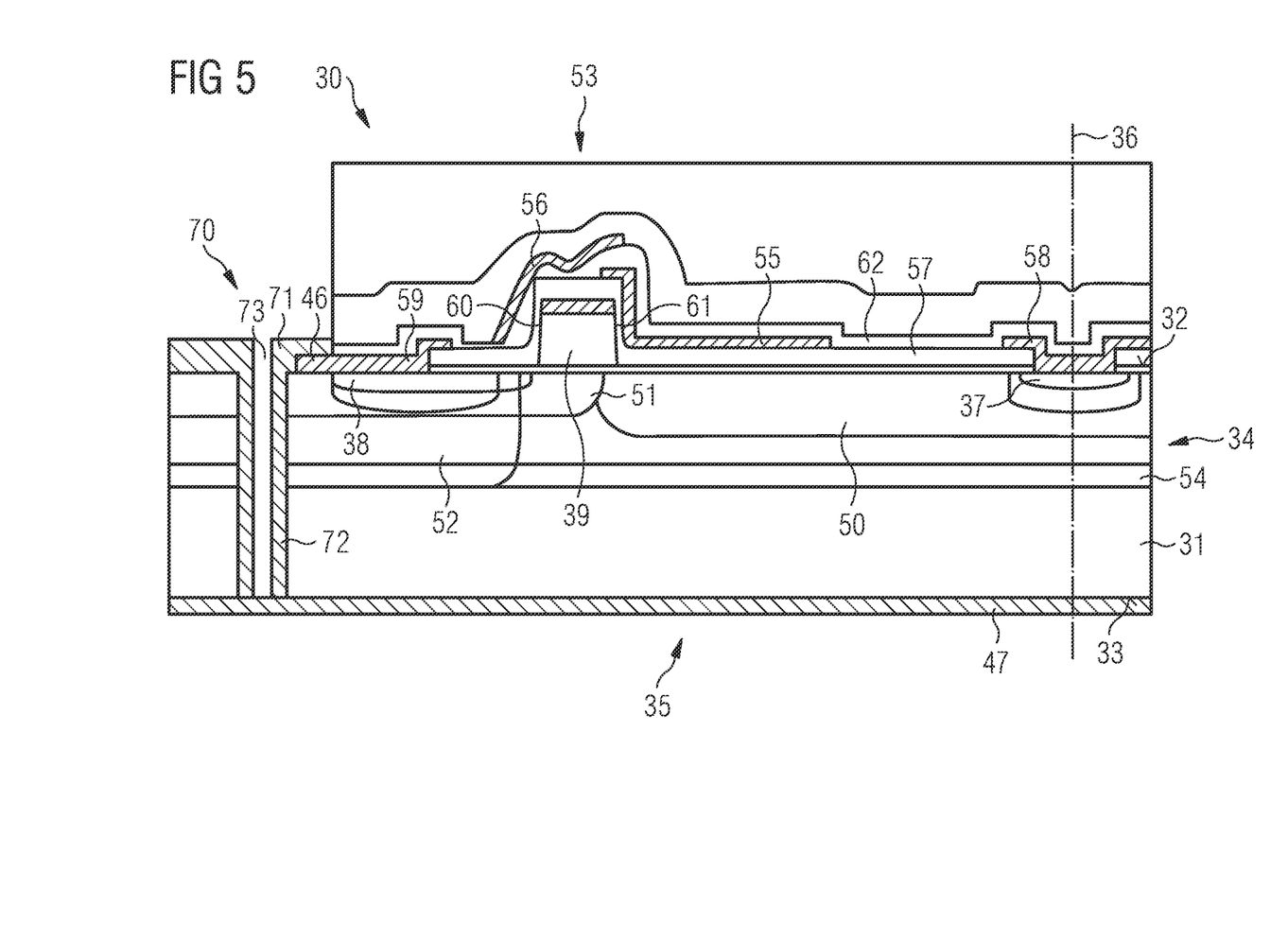
FIG. 5 illustrates a semiconductor device including a LDMOS transistor and a through substrate via.

FIG. 5 illustrates a structure for a through substrate via (TSV) 70 according to a further embodiment which may be used in the semiconductor device 30. The relationship between the illustrated dimensions of the LDMOS transistor structure 34 and through substrate via 70 is not to scale. In particular, for illustration purposes, the dimensions of the LDMOS transistor structure 34 are enlarged.

The TSV 70 includes a single conductive layer 71 which lines sidewalls 72 of the through substrate via 70 and surrounds a gap 73. The single conductive layer 71 and the gap 73 extend through the thickness of the substrate 31 from the front surface 32 to the rear surface 33. The conductive layer 71 also extends onto the front surface 32 of the substrate 31 and onto the conductive layer 46 coupled to the source region 38. One or more further layers may be arranged on the walls of the TSV 70 between the conductive layer 71 and the substrate 31 acting as an adhesion promotion layer, a diffusion barrier and/or seed layer, for example, Ti, TiN and a Cu seed layer may be deposited using Physical Vapour Deposition and/or Chemical Vapour Deposition techniques and the conductive layer 71 by electro-deposition techniques. The conductive layer 71 may be formed using dual damascene techniques.

Figure 6:
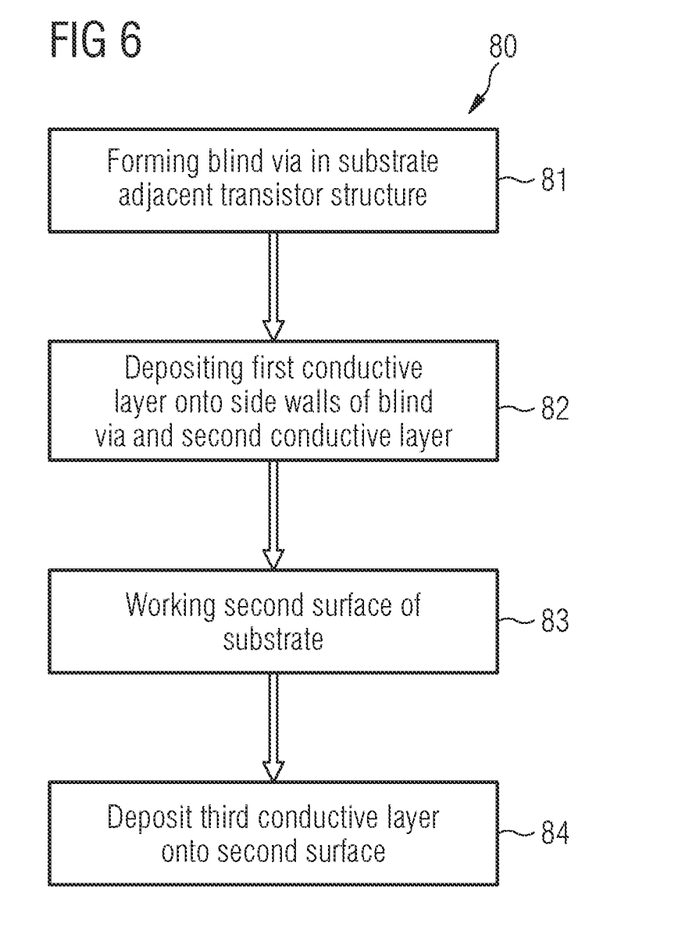
FIG. 6 illustrates a flowchart of a method for electrically coupling an electrode of a transistor structure in a first surface of a substrate to a conductive layer arranged at a second surface of the substrate.

FIG. 6 illustrates a flow chart 80 of a method for electrically coupling an electrode of a transistor structure arranged at a first surface of a substrate to a conductive layer arranged at a second surface of the substrate opposing the first surface. In block 81, a blind via is formed in the substrate adjacent the transistor structure. In block 82, a first conductive layer is deposited onto side walls of the blind via and onto a region of a second conductive layer arranged on the first surface of the substrate. The second conductive layer is positioned adjacent the blind via and is coupled to the electrode of the transistor structure. In block 83, the second surface of the substrate is worked to expose a portion of the first conductive layer. The second surface may be worked by grinding to remove material of the substrate at the rear surface, reducing the thickness of the substrate and exposing a portion of the first conductive layer within the via in the rear surface. In block 84, a third conductive layer is deposited onto the second surface of the substrate and the portion of the first conductive layer to electrically couple the third conductive layer with the electrode of the transistor structure.

The first conductive layer which is deposited onto the sidewalls of the blind via and onto the first surface of the substrate may be thicker that the second conductive layer arranged on the first surface which is coupled to the electrode. In some embodiments, the first conductive layer has a thickness $t_1$ and the second conductive layer has a thickness $t_2$, wherein $t_1 \geq 5t_2$. The first conductive layer may include high purity copper and the second conductive layer may include Ti.

The first conductive layer may be deposited by filling the base of the blind via with conductive material, and conformally depositing a conductive connection layer onto the conductive material, side walls of the blind via and the region of a second conductive layer arranged on the first surface of the substrate adjacent the blind via.

The first conductive layer may be deposited by electroplating. In embodiments, in which the base of the blind via is first filled with conductive material and a conductive connection layer in deposited onto the conductive material, side walls of the blind via and at least a portion of the second conductive layer, different electroplating conditions may be used for depositing the conductive material and conductive connection layer.

In some embodiments, the method may additionally include forming a dielectric layer over the conductive connection layer in the blind via, and forming a further dielectric layer over the open end of the blind via in the first surface thereby forming an enclosed cavity within the blind via.

The first conductive layer may be deposited by applying a mask to the first surface such that an opening is positioned over the blind via and a region of the second conductive layer and such that the electrode is covered by the mask and by applying the first conductive layer into the opening of the mask. The first surface of the substrate may then be planarised such that an upper surface of the first conductive layer is substantially coplanar with an upper surface of an oxide layer arranged on the first surface of the substrate. The through substrate via may be temporarily capped at the first surface before the first surface is planarised. Chemical mechanical Polishing may be used to planarise the first surface of the substrate.

A multilayer liner may be deposited into the blind via and onto the region of the second conductive layer on the first surface of the substrate adjacent the via and the first conductive layer deposited onto the multilayer liner. A portion of the multilayer liner deposited onto the side walls of the blind via may have a different number of layers than a portion of the multilayer liner deposited on the region of the second conductive layer on the first surface of the substrate.

The second conductive layer may be coupled to a source electrode of the transistor structure. In some embodiments, the transistor structure is a LDMOS transistor structure and the electrode is a highly doped source region of a silicon substrate. The silicon substrate may have a bulk resistivity $\rho \geq 100$ Ohm·cm.

A method for electrically coupling an electrode of a transistor structure arranged in a first surface of the substrate to a conductive layer arranged at the second surface of the substrate, whereby the second surface opposes the first surface, will now be described with reference to FIGS. 7 to 12.

Figure 7:
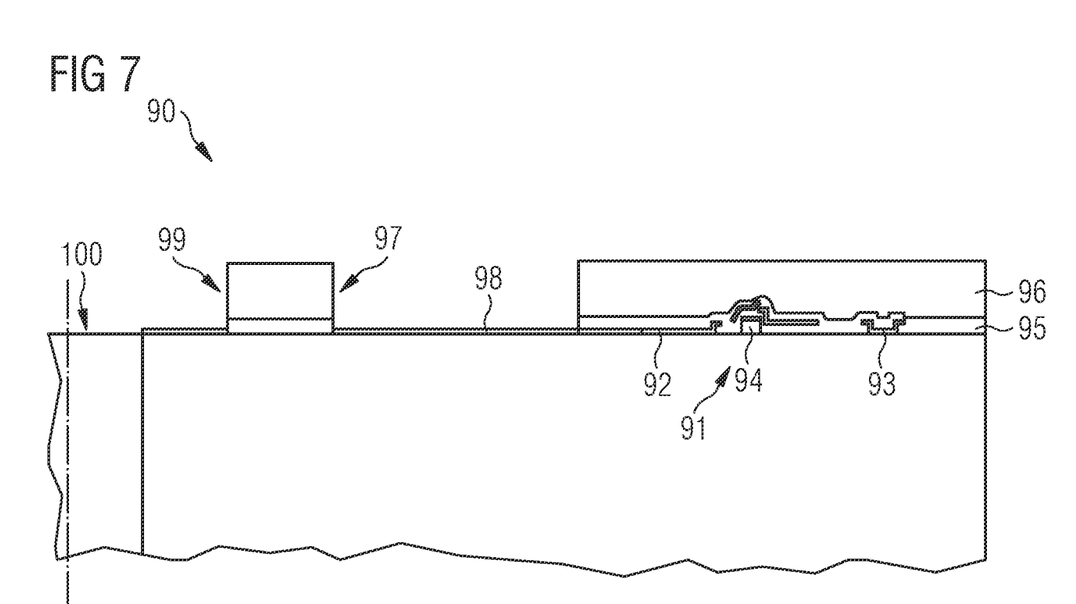
FIG. 7 illustrates a portion of a semiconductor device including a LDMOS transistor.

FIG. 7 illustrates a portion of a semiconductor substrate 90 including an LDMOS transistor 91 arranged in a front surface 92 of the substrate 90. The LDMOS transistor includes a source metal contact 92, a drain metal contact 93 and a gate metal contact 94 arranged on the front surface 92. The region of the substrate 90 directly above the active portion of the LDMOS transistor 91 is covered by a stack of an oxide layer 95 and a dielectric layer 96. The oxide layer 95 and the dielectric layer 96 include a first opening 97 adjacent the active area of the LDMOS transistor 91 and a second opening 99. A conductive layer 98 forms the base of the first opening 97 and at least part of the second opening 99 which is part of the source metal contact 92.

In FIGS. 7 to 10, only the right hand portion of the second opening 99 and the region of the substrate 90 near the upper surface 92 is illustrated.

Figure 8:
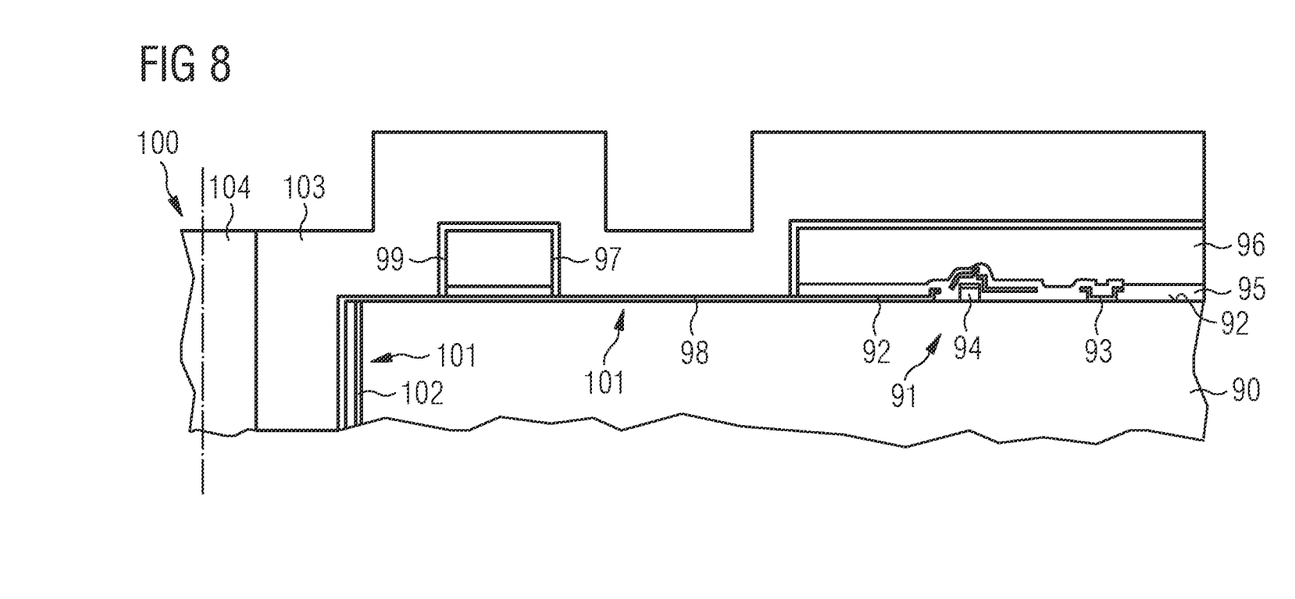
FIG. 8 illustrates the semiconductor device of FIG. 7 further including a conductive layer.

FIG. 8 illustrates the semiconductor substrate 90 after the formation of a blind via 100 in the front surface 92 in the opening 99. A multilayer lining 101 is deposited on sidewalls 102 of the blind via 100, the portion of the front surface 92 of the substrate 90 and conductive layer 98 exposed in the openings 97, 99 and on the outer surfaces of the dielectric layer 96. A conductive layer 103 including high purity copper is deposited on the multilayer lining 101 such that the conductive layer 103 lines the blind via 100 and extends over the front surface 92 of the substrate 90 and covers the oxide layer 95 and dielectric layer 96. The thickness of the conductive layer 103 may be such that the openings 99 and 97 are substantially filled with conductive material and the portion of the layer 103 on the sidewalls of the blind via 100 surrounds a gap 104.

Figure 9:
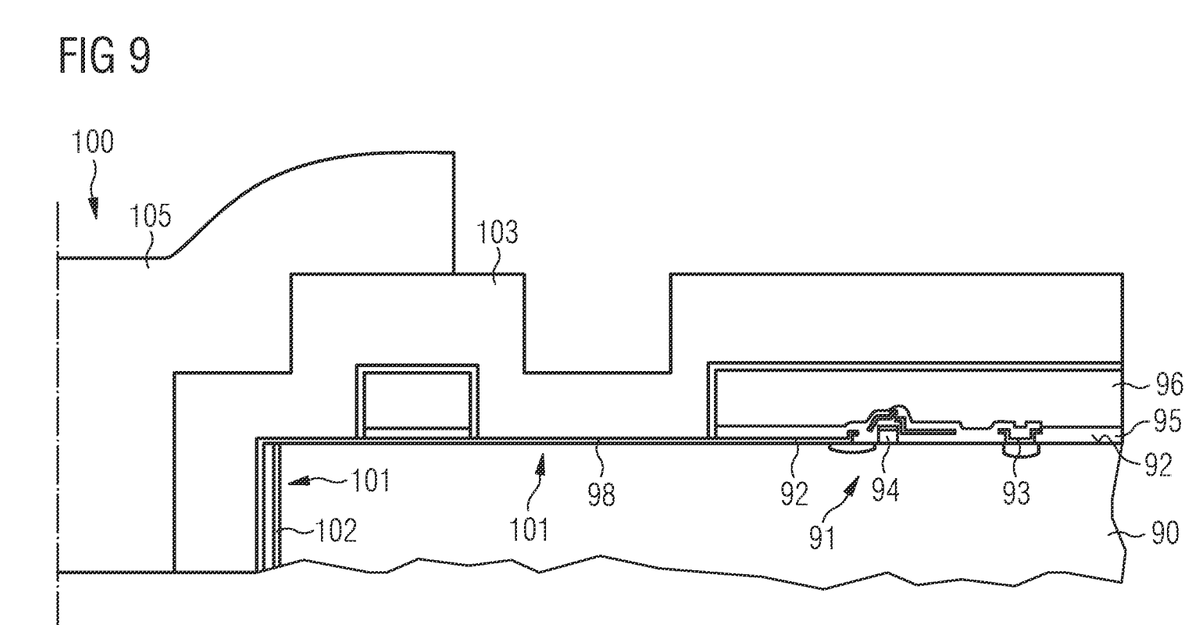
FIG. 9 illustrates the semiconductor device of FIG. 8 including a resist layer arranged in a through substrate via.
Figure 10:
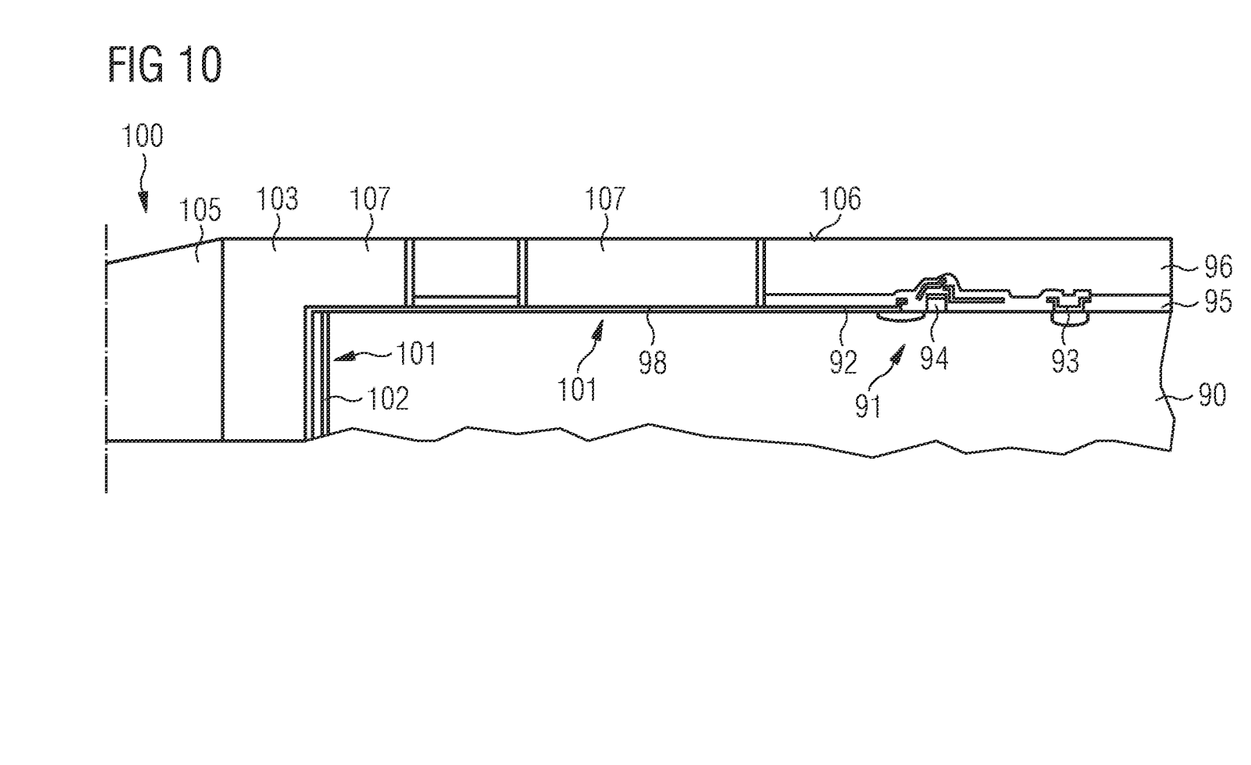
FIG. 10 illustrates the semiconductor device of FIG. 9 after a planarisation process.

FIG. 9 illustrates substrate 90 after insertion of a resist 105 into at least the upper portion of the gap 104 in the blind via 100 at the front side 92 of the substrate 90. Protruding regions of the resist 105, conductive layer 103 and uppermost portion of the dielectric layer 96 may be removed to produce a substantially planar surface 106 in which portions 107 of the conductive layer 103 are arranged in the openings 97, 99 in the dielectric layer 96, as is illustrated in FIG. 10. The conductive portions 107 may be substantially surrounded by dielectric material 96. Such methods are known as dual damascene processes, since a vertical conductive layer is formed in the through substrate via 101 and a lateral conductive layer is formed on the front surface 92 of the substrate 90 using a single deposition process and conductive portions embedded in a dielectric matrix are formed. The resist 105 may then be removed from the blind via 100.

Figure 11:
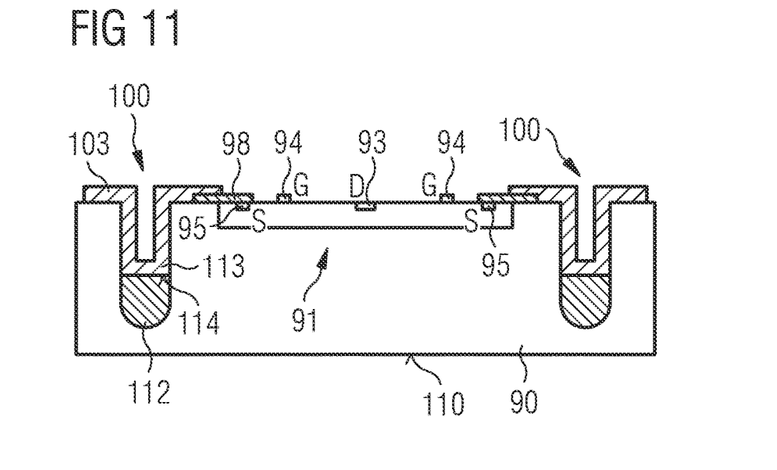
FIG. 11 illustrates a schematic cross-sectional view of the semiconductor device of FIG. 10.

FIG. 11 illustrates a view of the substrate 90 in which the rear surface 110 of the substrate 90 is visible. As can be seen in FIG. 11, the lowermost surface of the blind via 100 is positioned within the substrate 90.

The conductive layer 103 may be deposited using a two stage process and includes two subparts. The conductive layer 103 may be deposited by first depositing a first subpart 112 in the base of the blind via 100 which completely filled the base of the blind via 100 to provide a type of conductive plug arrangement. The second subpart 113 has the form of a layer which covers the sidewalls of the blind via 100 and the upper surface 114 of the conductive plug such that the second subpart 113 surrounds a gap 115 in the upper portion of the blind via 100. The second subpart 113 may have a U-shaped form in the as-deposited state.

The first subpart 112 and the second subpart 113 may be deposited by electroplating. The conditions used to electroplate the first subpart 112 and the second subpart 113 may be selected in order that vertical growth is favoured and lateral growth is suppressed during deposition of the first subpart 112 in order to fill the volume of the blind via 100 and that lateral growth is favoured during growth of the second layer 113 so as to produce a lining which surrounds the gap 115. The first subpart 112 and the second subpart 113 may have different microstructures. For example, the first subpart 112 may have an average grain size that is larger than an average grain size of the second subpart 113.

In some non-illustrated embodiments, the conductive layer 103 coats the sidewalls of the though substrate via and surrounds a gap which extends through the entire thickness of the substrate 90.

In subsequent processing steps the substrate 90 may be subjected to raised temperatures, for example during a subsequent annealing process. The raised temperatures may cause grain growth within the first subpart 112 and second subpart 113 such that the interface between the base of the second subpart 113 and first subpart 112 is no longer discernible. The region of the second subpart 113 arranged on the side walls of the blind via 100 may be discernible from the first subpart 112 which fills the blind via 100 by a difference in microstructure, for example a smaller average grain size.

Figure 12:
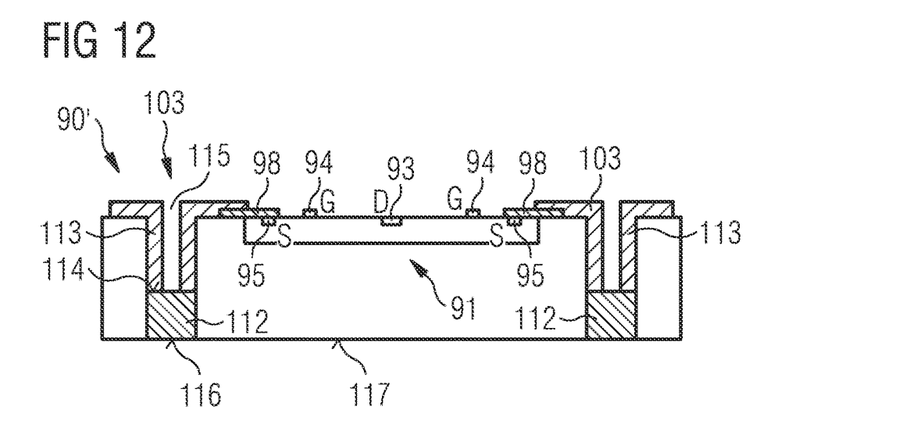
FIG. 12 illustrates a schematic cross-sectional view of the semiconductor device of FIG. 11 after removal of a portion of the rear surface of the substrate.

In order to electrically couple the source to the rear surface 110 of the substrate 90, the rear surface 110 of the initial substrate 90 is worked to remove material and expose the base 116 of the blind via 101 in the rear surface 117 of the final substrate 90' as is illustrated in FIG. 12. The finished thickness of the substrate 90' may be reduced to around 60 µm.

A conductive area is formed in the rear surface 111 by the exposed base 116 of the first subpart 112 of the conductive layer 103. The first subpart 112 and second subpart 113 provide a conductive via 119 which extends from the rear surface 117 to the front surface 92 of the final semiconductor substrate 90'.

Figure 13:
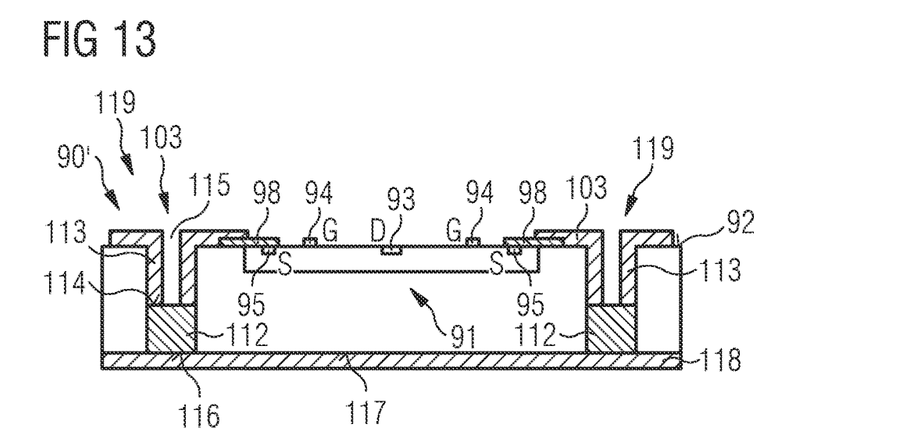
FIG. 13 illustrates a schematic cross-sectional view of a conductive layer applied to the rear surface of the substrate.

FIG. 13 illustrates one or further conductive layers 118 deposited on the rear surface 117 of the final semiconductor substrate 90' and base 116 of the conductive via 119. The conductive layer 118 is coupled to the source 95 by means of the conductive layer 103. The conductive layer 118 on the rear surface 117 of the final substrate 90' may be used to mount the device and electrically couple the source 95 to a die pad or flange.

Figure 14:
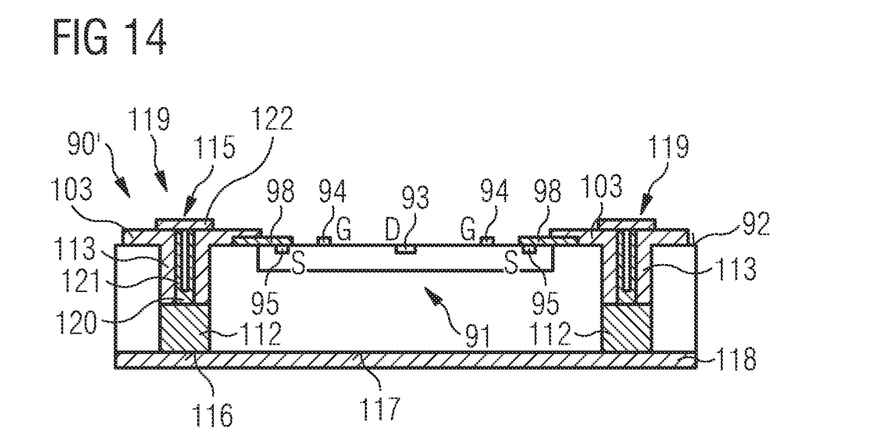
FIG. 14 illustrates a schematic cross-sectional view of a semiconductor device including a LDMOS transistor.

FIG. 14 illustrates an embodiment of the semiconductor substrate 90' in which the gap 115 surrounded by the second subpart 113 of the conductive via 119 is capped by a dielectric layer 122 arranged on the first conductive layer 103 on the front surface 92 of the substrate 90' to form a cavity 120 or void within the conductive via 119.

In some embodiments, the cavity 120 may be defined by a first dielectric layer 121 which lines the gap 115 and a second dielectric layer 122 which forms a cap to the open end of the conductive via 119. The second dielectric layer 122 together with the first dielectric layer 121 defines all sides of the cavity 120.

The semiconductor device including one or more LDMOS transistors according to any one of the embodiments described herein may be used in a high frequency power amplifying circuit, such as RF power amplifying circuits for use in cellular communications operating at frequencies in the range of 700 MHz to 3.6 GHz, power conversion in cellular communication networks and Doherty configuration amplifying circuits.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising a front surface;
a lateral transistor arranged in the front surface of the semiconductor substrate and having an intrinsic source;
a through substrate via;
a first conductive layer lining side walls of the through substrate via and extending from the through substrate via onto the front surface of the semiconductor substrate and electrically coupled with the intrinsic source of the lateral transistor; and
a second conductive layer arranged on the front surface of the substrate and extending laterally from the intrinsic source of the lateral transistor towards the first conductive layer,
wherein the first conductive layer is arranged on a portion of the second conductive layer,
wherein the first conductive layer directly contacts a sidewall of the through substrate via and directly contacts a portion of the front surface of the semiconductor substrate between the sidewall of the through substrate via and a region of the second conductive layer arranged on the front surface of the semiconductor substrate.

2. The semiconductor device of claim 1, wherein the first conductive layer comprises copper.

3. The semiconductor device of claim 1, wherein the first conductive layer has a thickness $t_1$ and the second conductive layer has a thickness $t_2$, and wherein $t_1 \geq 5t_2$.

4. The semiconductor device of claim 1, wherein the first conductive layer comprises copper and the second conductive layer comprises Ti or TiN.

5. The semiconductor device of claim 1, further comprising a third conductive layer on a rear surface of the substrate electrically coupled to the intrinsic source of the lateral transistor by way of the first conductive layer and the second conductive layer.

6. The semiconductor device of claim 1, wherein the first conductive layer is a single integral unit consisting of a same material throughout.

7. The semiconductor device of claim 6, wherein the single integral unit of the first conductive layer covers and directly contacts the region of the second conductive layer arranged on the front surface of the semiconductor substrate.

8. The semiconductor device of claim 1, further comprising a multilayer liner between the first conductive layer and the side walls of the through substrate via and the front surface of the substrate.

9. The semiconductor device of claim 8, wherein a portion of the multilayer liner on the side walls of the through substrate via has a different number of layers from a portion of the multilayer liner deposited on the front surface of the semiconductor substrate.

10. The semiconductor device of claim 8, wherein the multilayer liner is in direct contact with the substrate.

11. The semiconductor device of claim 1, further comprising a conductive plug arranged at a base of the through substrate via, wherein the first conductive layer is arranged on the conductive plug.

12. The semiconductor device of claim 11, wherein the through substrate via further comprises one or more dielectric layers on the first conductive layer enclosing a cavity within the through substrate via.

13. The semiconductor device of claim 1, wherein the semiconductor substrate is a silicon substrate having a bulk resistivity $\rho \geq 100$ Ohm·cm.

14. The semiconductor device of claim 1, wherein the first conductive layer is coupled to a source electrode of the lateral transistor.

15. The semiconductor device of claim 1, wherein the intrinsic source of the lateral transistor has a doping concentration of at least $5.10^{19}$ cm$^{-3}$.

16. The semiconductor device of claim 1, wherein the first conductive layer provides a redistribution path that has a vertical portion within the through substrate via and a lateral portion on the front surface of the semiconductor substrate.

* * * * *